United States Patent [19]

Drumheller

[11] Patent Number: 4,485,387
[45] Date of Patent: Nov. 27, 1984

[54] INKING SYSTEM FOR PRODUCING CIRCUIT PATTERNS

[75] Inventor: Carl E. Drumheller, Pittsford, N.Y.

[73] Assignee: Microscience Systems Corp., Pittsford, N.Y.

[21] Appl. No.: 436,862

[22] Filed: Oct. 26, 1982

[51] Int. Cl.³ .......................................... G01D 15/16
[52] U.S. Cl. ............................ 346/140 R; 118/697; 118/401; 118/410; 364/489
[58] Field of Search ..................... 346/140 R; 118/401, 118/410, 415, 506, 697; 364/468, 488–491, 520

[56] References Cited

U.S. PATENT DOCUMENTS

| 3,820,121 | 6/1974 | Rich | 346/140 R |
| 3,864,695 | 2/1975 | Nagashima | 346/140 R X |
| 3,961,599 | 6/1976 | Jones | 118/410 X |
| 4,291,642 | 9/1981 | Kolc | 118/415 |

OTHER PUBLICATIONS

Zarnow, David F., An Introduction to the Navy Mfg. Technology Program For Computerized Thick Film Printing; Int. Symp. on Microelectronics, ISHM, 1978.
Shankin, Morris, Write It, Don't Screen It; Int. Symp. on Microelectronics, ISHM, 1978.
Reverse Engineering Corp, "Thick Film Writing Systems", A Product Bulletin.

Primary Examiner—Joseph W. Hartary
Attorney, Agent, or Firm—Martin LuKacher

[57] ABSTRACT

Thick film inking system where circuit patterns are written by ink feed through an orifice of a writing pen. Line cross-section is controlled by synchronous positive displacement pumping of ink through the orifice with the motion of the substrate with respect to the pen. A dynamic pen control system provides spring and mass compensation and maintains positive, prescribed pen force on the extruding ink thereby maintaining the desired thickness to width ratio of the lines.

36 Claims, 13 Drawing Figures

INKING SYSTEM FOR PRODUCING CIRCUIT PATTERNS7

The U.S. Government has rights in this invention pursuant to contract N00163-79-C-0175 awarded by the Naval Air Systems Command.

DESCRIPTION

The present invention relates to an orifice printing system which produces patterns by writing on an substrate with inks which are dispensed through the orifice, and particularly to a writing system wherein inks are dispensed through a writing orifice to print thick film circuit patterns on a substrate.

The invention is especially suitable for use in a CAD/CAM (computer aided design - computer aided manufacture) system for producing thick film circuit patterns on insulating substrates, such as ceramic plates.

In the past most thick film circuit patterns were produced by screen printing through masks. The process of screen printing has been found time consuming and expensive. It is difficult to obtain repeatable and uniform circuit performance particularly for circuits designed for high frequency applications. Earlier work on thick film printing involved the use of orifice writing systems in which thick film inks are dispensed through a writing orifice to produce the lines making up a circuit pattern on the substrate. With such orifice writing systems, however, it has been difficult to obtain controlled, uniform cross-section of inked lines and filled areas, particularly at different writing speeds.

It is a principal object of the present invention to provide an improved inking system for producing circuit patterns wherein ink is dispensed from an orifice writing pen which provides controlled, uniform cross-section of lines over a wide range of line width (e.g., four to twelve mils) and a wide range of writing speeds of relative movement of the substrate with respect to the pen (e.g., 0.05 to 5 inches per second).

It is a further object of the present invention to provide improvements in thick film orifice printing technology which enables the production of long line lengths in various patterns as well as uniform fill in areas.

It is a still further object of the present invention to provide an improved inking system for producing circuit patterns in which the starts and terminations of lines are controlled to achieve uniformity of cross-section at both ends of the line as well as along the length of the line between the ends thereof.

It is a still further object of the present invention to provide an improved inking system for producing circuit patterns through the use of a pen with a writing orifice having interchangeable pen assemblies for handling a wide variety of conductor, dielectric and resistor inks, with interchangeable pen tips for different line widths.

It is a still further object of the present invention to provide an improved inking system for producing circuit patterns which allows for variations in the camber of the substrate, as on crossovers of previously written lines, without the need of outrigger or other surface contour following probes, and therefore is capable of producing various circuit patterns, even if convoluted and containing crossovers and closely adjacent lines; thus providing for topology independence in inking sequence.

Briefly described, a system for producing patterns on a substrate in accordance with the invention uses a member having an orifice (a writing pen). The system includes means for moving the substrate with respect to the pen. Means are provided for controllably feeding ink through the pen orifice at a volume rate synchronous with the rate of relative movement of the member and substrate. This system may also include means responsive to the viscous forces on the ink flowing from the orifice upon the substrate which dynamically controls the vertical displacement of the pen to maintain a constant thickness of line in the pattern for a given cross-sectional area of the line.

The foregoing and other objects features and advantages of the invention as well as presently preferred embodiments thereof, will become more apparent from a reading of the following description in connection with the accompanying drawings in which.

Figure 1:
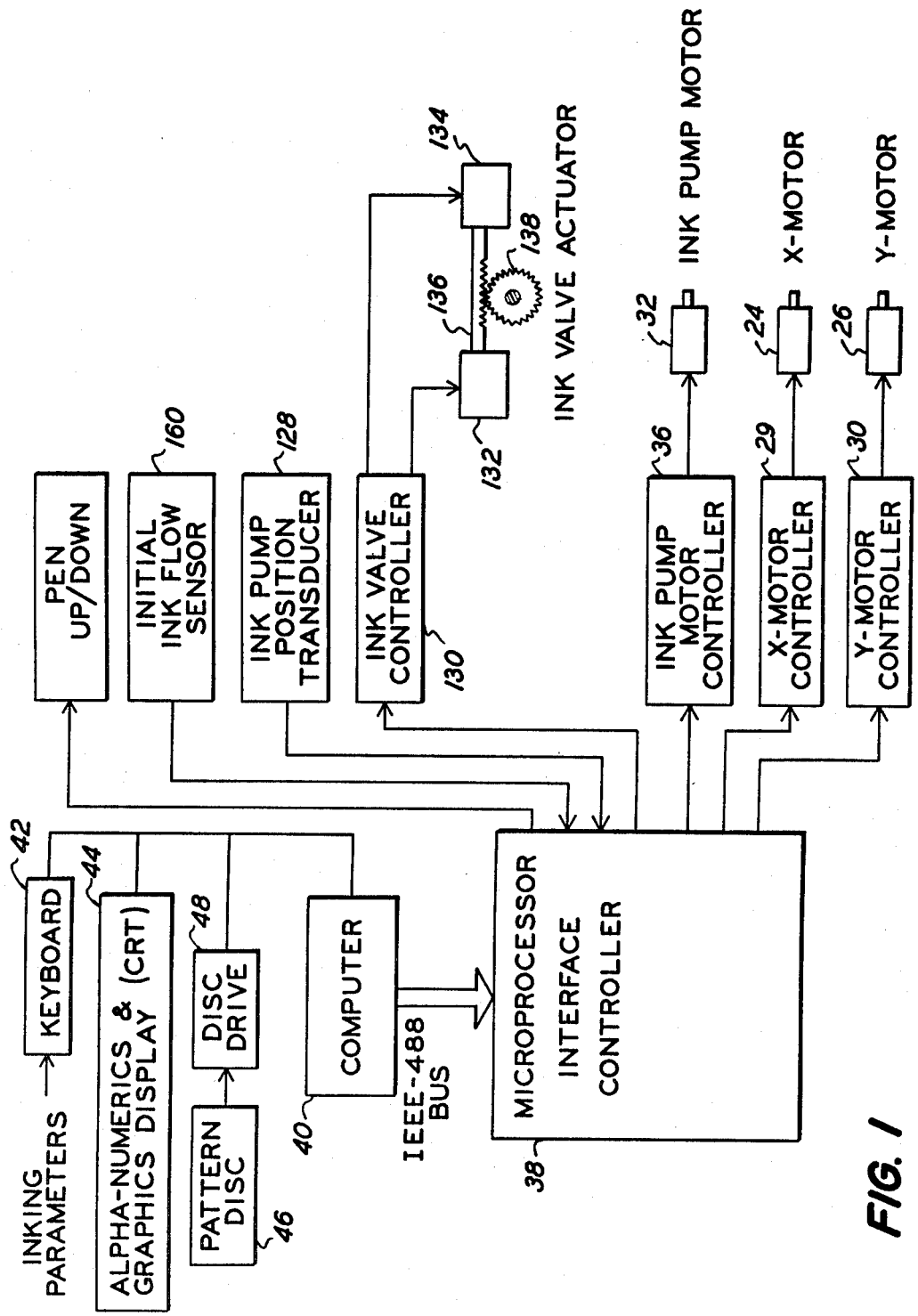
FIG. 1 is a block diagram of an inking system provided in accordance with the invention showing, principally, portions of the system concerned with synchronous positive displacement ink feed through the writing orifice of the pen used in the system.

Referring more particularly to FIG. 1, a system is shown which may be used for the development of circuit patterns for thick film hybrid circuits as well as for the computer aided manufacture of such circuits.

Figure 2:
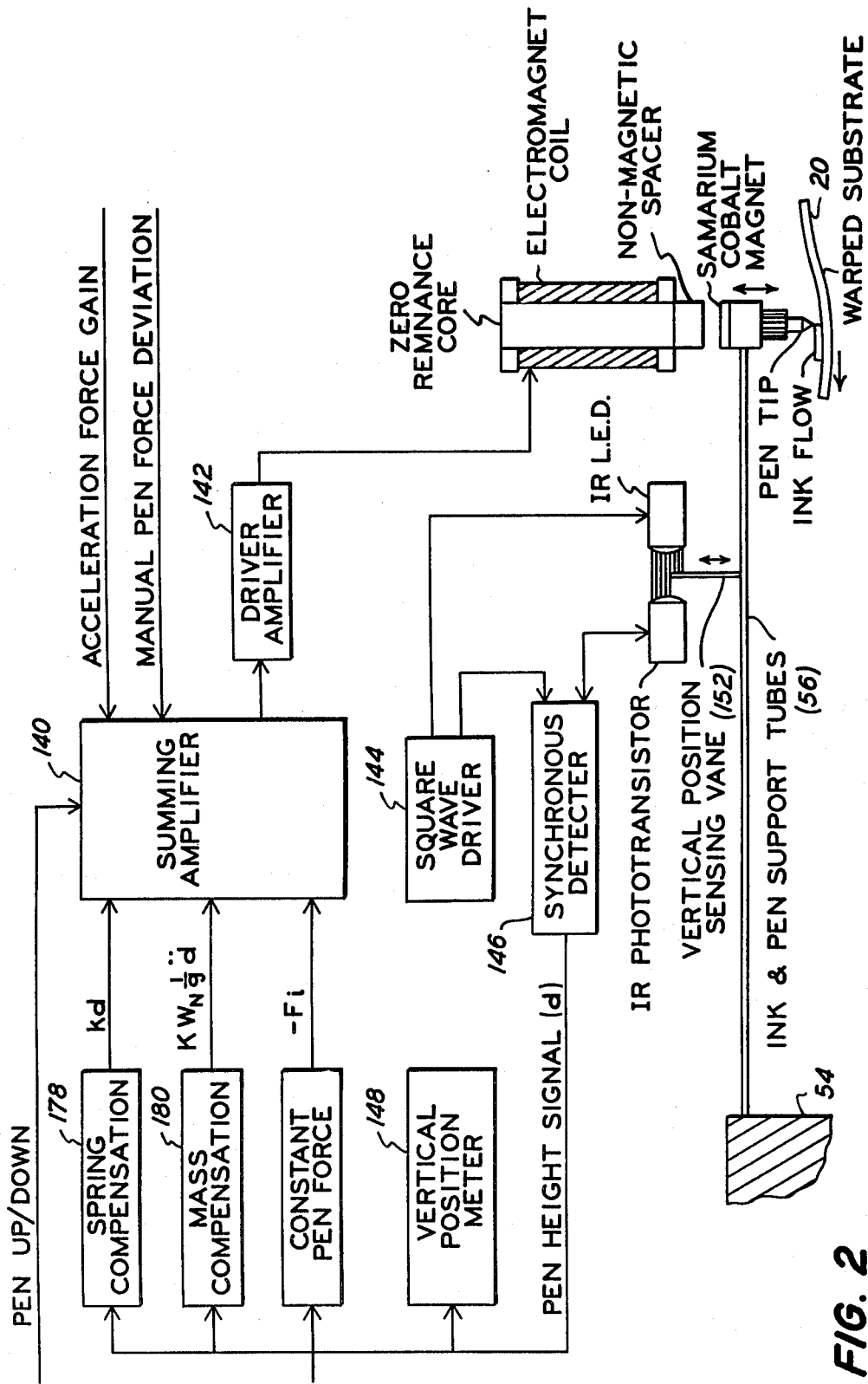
FIG. 2 is a block diagram showing the pen used in the system described in FIG. 1 as well as components thereof which provide for dynamic pen control based on sensing ink flow through the orifice at the pen tip.

The circuit is printed by writing the pattern on a substrate with standard thick film ink material. The pen having the writing orifice and the mechanism for lifting and depressing the pen with respect to the substrate (an electromagnet coil) is shown in FIG. 2. The substrate 20 (FIG. 3) is mounted on an xy translator table 22 which is driven in the x direction by a motor 24 and in the y direction by another motor 26. These motors drive the table to a obtain a desired tangential speed with respect to the pen tip 28 having the writing orifice.

FIG. 1 shows the motor controller 29 for the x motor 24 and the motor controller 30 for the y motor 26. Also shown is an ink pump motor 32 which is controlled by an ink pump motor controller 36. The motor controllers, 29, 30, and 36 translate command pulses generated by a microprocessor interface controller 38 into signals which drive the motors. The number of pulses determines the displacement produced by the motors and the pulse rate determines the velocity of that displacement. The motors may be rotary motors with screw drives or other gearing to translate the rotary motion to linear motion. Linear motors may also be used.

A computer determines the pen path topology for the pattern which may consist of rectangles, paths, triangles and arcs for any chosen pen width. The computer data is transferred by way of a data bus (suitably the IEEE-488 bus) to the controller 38. The computer is equipped with a keyboard 42 into which the operator can input the inking parameters, such as the cross-sectional areas of the lines which are to be written and the writing speed of the pen. Circuit development can be accomplished through the use of the keyboard together with other input devices such as a digitizer/tablet. The pattern may be displayed together with other information concerning inking parameters in alpha-numeric form on a graphics display such as a cathode-ray tube display 44. A printer with graphics display capability and a plotter may also be tied to the computer as peripheral devices. The pattern of the circuit may be created in the computer aided design operation of the system and stored on a disk or other storage medium 46. A floppy disk storage system using a disk drive 48 may suitably be connected to the computer as a peripheral device for reading and writing on the disks. The computer aided design aspect of the system may be carried out with techniques used in the art for computer aided design (CAD) purposes.

Figure 3:
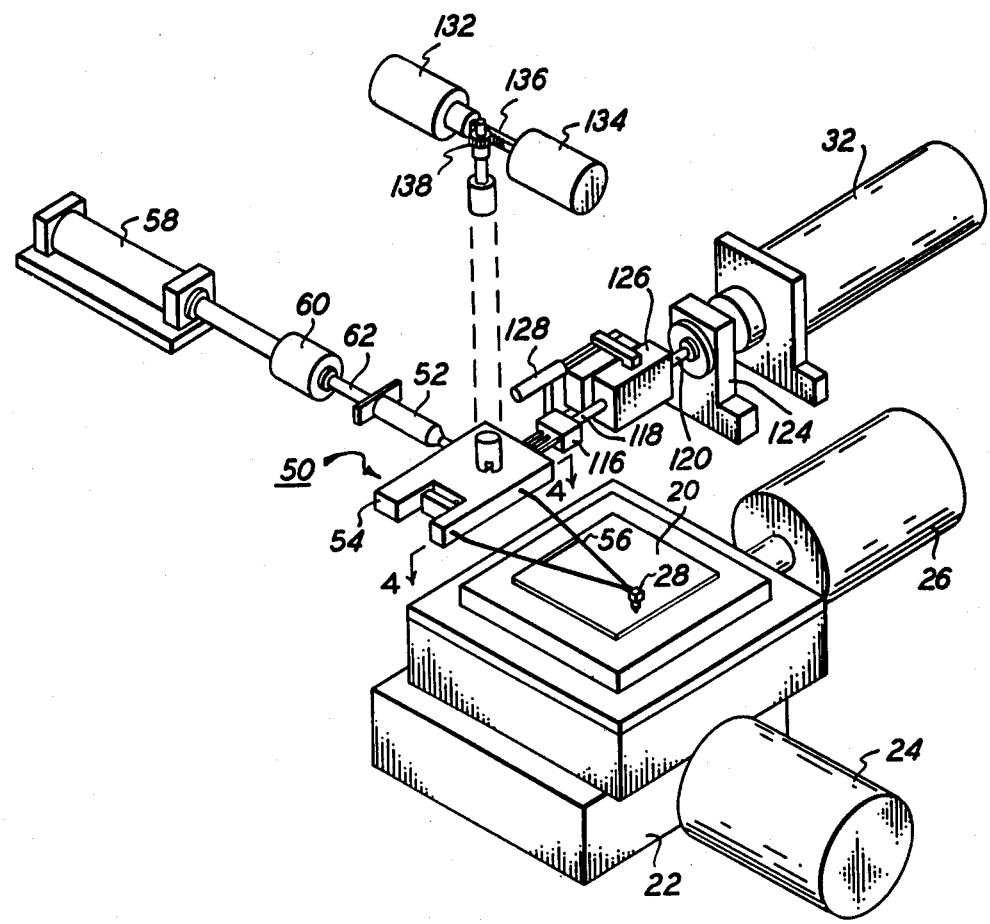
FIG. 3 is a perspective view schematically showing the mechanisim of the inking system illustrated in FIGS. 1 and 2, but with the sensors and actuators associated with the pen for dynamic pen control, which are shown in FIG. 2, removed, to simplify the illustration.

The pen 28 is part of an interchangeable pen-pump assembly 50 (See FIG. 3). Several assemblies which contain a syringe 52, a positive displacement pump mechanisim in a pump block 54, the pen tip 28 and a flexural, A-frame support 56 for the pen tip are provided. The pen tips may be ceramic, metal or plastic and have orifices of various size to change the line width when the pen tip is changed. The ink supply is from the syringe 52. The syringe of each interchangeable assembly 50 may be loaded with a different ink material. For example, conductor, dielectric and resistor inks may be loaded into the syringes of the various pen assemblies. Different assemblies may be used for different resistor inks for different resistivities. Inks can be changed readily by interchanging the pen assemblies 50.

The syringes 52 are desirably loaded with ink under vacuum conditions to avoid the inclusions of air or other gas in the ink material. Inasmuch as the syringes 52 are airtight, the pen assemblies 50 can be stored for in a loaded condition for long periods of time without affecting inking quality.

A pneumatic piston 58 provides constant force via a coupling 60 to the plunger 62 of the syringe 52. The pump block 54 contains a double acting pump mechanisim. A passage 64 from the syringe goes to a central valve opening 66 (See FIG. 4). A cylindrical valve body 68 in the opening 66 provides a four-way valve which alternately directs the ink supply to different pump volumes 70 and 72 defined in a bore 84. The double acting pump has two rams 74 and 76 which displace the pump volumes alternately to pump ink through an outlet passage 78. The outlet passage 78 is in communication with a tube 80 which has a conduit for ink delivery to the pen 28. The other tube 82 of the A-frame 56 provides added flexural support for the pen 28.

The valve 68 has two positions 90 degrees apart so that the syringe fills one of the volumes 70 and 72 while one of the rams is 74 or 76 is pumping ink out of the other volume to the pen.

Figure 5:
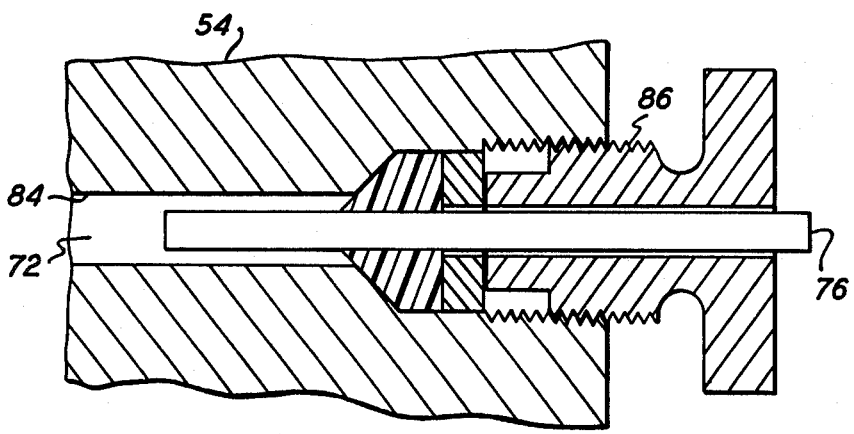
FIG. 5 is an enlarged fragmentary sectional view of the ram of the positive displacement pumping mechanisim shown in FIG. 4, the section being taken in the general area of the circle indicated in FIG. 4 by the numeral 5, which numeral is contained in a balloon.

The ram 76 is shown by way of example in FIG. 5. It is a rod which is disposed in the bore 84 in the pump block 54 which provides, in part, the pump volumes. A bleed port for air (not shown) may be provided and opened during initial charging of each of the pump volumes with ink. After air is purged the bleed ports are closed. Seal arrangements, including retainer nuts 86 close the pump volumes with which the rams interact. Inasmuch as the ink is in a small closed pump volume 70 or 72, the displacement of the rams 74 or 76 provides a positive volume displacement of the ink from the pump block to the pen. It is desirable that a pressure relief valve be disposed in communication with the passage 78 so as to relieve the pressure in the pump volume which is being pumped in the event of a pen clog. Accordingly during inking, one side of the double acting pump is pumping ink hydraulically from one pump volume, while the other pump volume is being refilled pneumatically. As noted above, ink is delivered to the pen 28 through the pen support tube 80 by positive displacement of the small, closed ink volume. As will be described more fully below this positive displacement is in synchronisim with the table movement and thus with the tangential writing speed of the pen 28.

Figure 7:
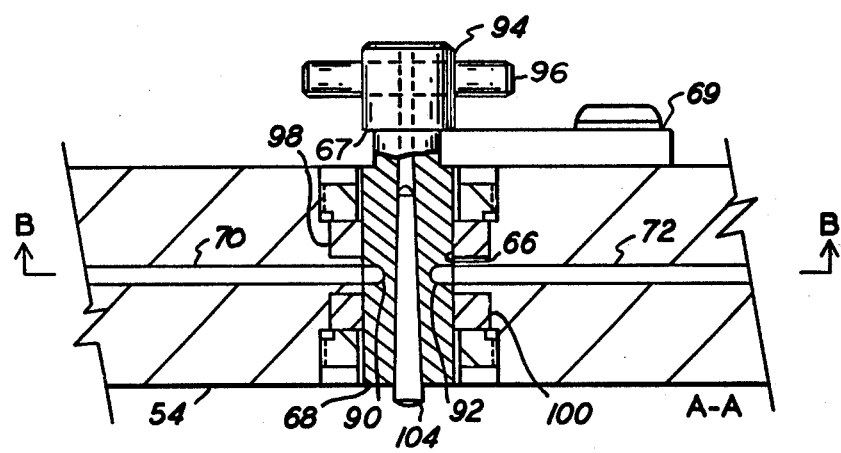
FIG. 7 is a enlarged fragmentary sectional view of the valve assembly shown in FIG. 6, taken along the line A—A in FIG. 6.
Figure 6:
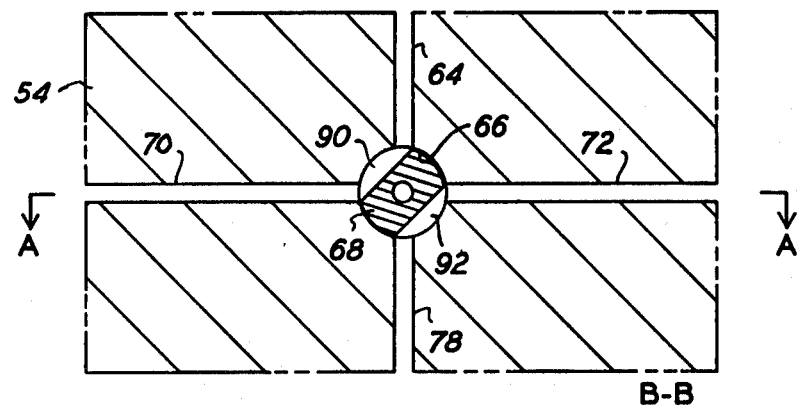
FIG. 6 is an enlarged fragmentary sectional view illustrating the valve assembly used in the constant displacement pumping assembly shown in FIGS. 3-5, the section being taken along the line B—B in FIG. 7.

The valve is shown is greater detail in FIGS. 6 and 7. The valve body 68 is a cylinder, preferably made of plastic material such as Delrin which is filled with Teflon particles. The passages through the valve are provided by slots 90 and 92 in the valve body which are opposite to each other. These slots 90 and 92 are positioned at 45° with respect to the bores providing the pump volumes 70 and 72 as shown in FIG. 6. By turning the valves 90° from what is shown in FIG. 6 the pump volume 70 may be connected to the syringe delivery passage 64, while the pump volume 72 is connected to the pen delivery passage 78. A coupling 94 in the form of a pin 96 passing through the head of the valve body 68 is provided for rotating the valve body 90°.

The valve body 68 is undercut at 67 to form a step. A valve pin retainer plate 69 has its forward end in the undercut and holds the valve body in place in the pump block 54 while the allowing the valve body to rotate.

Figure 8:
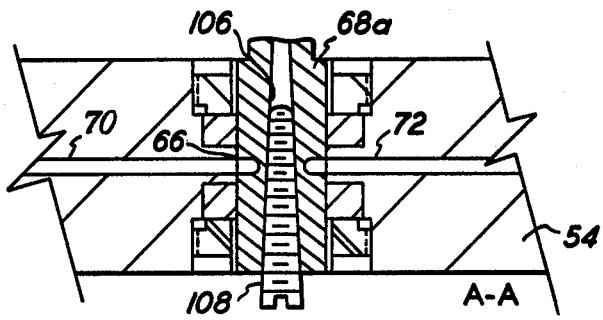
FIG. 8 is a view of the valve assembly similiar to the view of FIG. 7, and showing another embodiment thereof.

It has been found desirable that the valve be a zero clearance valve to prevent a flow of ink between the pump volumes 70 and 72 at the high pressures generated in the pump block. A zero clearance also assists in preventing the abrasive particles commonly found in thick film ink material from penetrating into the interface between the valve body 68 and the opening 66 in the block 54. Seals 98 and 100 held down by seal retainer nuts are disposed on the opposite sides of the passages 64, 70, 72 and 78 in the pump block 54. In order to facilitate obtaining a zero clearance valve, a tapered opening is provided axially in the valve body 68. A tapered pin 104 is inserted into this opening and spreads the plastic material of the valve body 68 to provide the zero clearance fit. Alternatively, and as shown in FIG. 8, a threaded tapered aperture 106 in which a threaded tapered pin 108 is screwed may be used to provide the adjustment for zero clearance fit. While Delrin AF filled with Teflon is presently preferred for use as the valve body other materials such a nylon, Teflon and other phenolic resin plastic materials may be found suitable.

Figure 4:
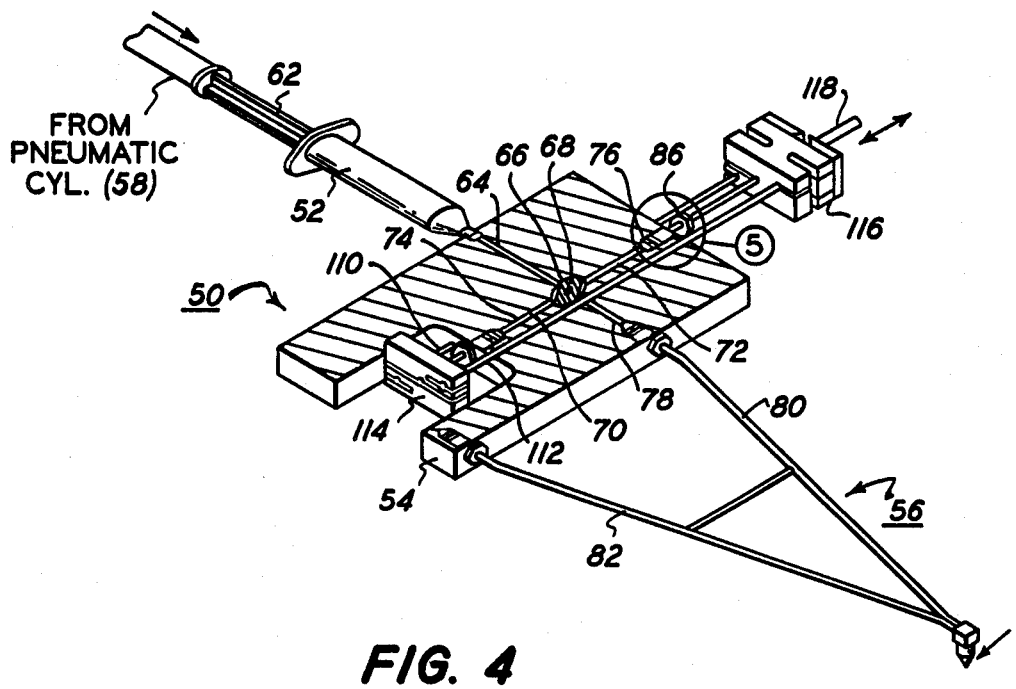
FIG. 4 is an enlarged perspective view showing the interchangeable pen assembly of the system shown in FIG. 3, the view being partially in section, the section being taken along the line 4—4 in FIG. 3.

As shown in FIG. 4 the pump block 54 has bores above and below the central level of the block in which the passages 64 and 78 and the pump volumes 70 and 72 are disposed. Rods 110 and 112 are located in these bores. These rods 110 and 112 join the two double acting rams 74 and 76 together through coupling blocks 114 and 116 so that they act in concert as a double acting pump. A single drive rod 118 is used to drive both rams via the couplings 116 and 114 and the tie rods 110 and 112. The coupling 116 may have a quick disconnection so that the assembly 50 can be interchanged with like assemblies carrying different inks.

The motor 32 (See FIG. 3) turns a drive screw 120 through a preloaded angle contact bearing set 124. The rotary motion of the drive screw 120 is converted into linear motion of the pump drive shaft 118 by a driven nut, ball slide arrangement 126. The position of the pump is sensed by a linear position transducer 128 which may be a linear potentiometer which is coupled to the linearly moving part of the driven nut ball slide arrangement 126. As shown in FIG. 1, the transducer 128 provides an output to the microprocessor interface controller 38 indicating the position (displacement) of the pump. The microprocessor interface has stored therein data representing the total line length and ink volume necessary to complete the writing the next anticipated line in the pattern. If the position transducer indicates that the remaining displacement volume is insufficient to complete the next anticipated line of the pattern, an output is provided to a controller 130 (see FIG. 1) from the microprocessor interface controller. This controller outputs drive current to an ink valve actuator 132 utilizing opposed solenoids 132 and 134 which reciprocate a rack 136 to drive a spur 138 90° so as to turn the valve body 68. Accordingly when the double acting pump is reversed by signals applied to the ink pump motor 32 via the ink pump motor controller 36, the ink will be pumped from the recharged pump volume and the previously used pump volume will be placed in communication with the syringe for recharging. Other actuators may be used for the ink valve, such pneumatically controlled cylinders.

Synchronous positive displacement pumping which assures controlled, uniform cross-section of ink lines and filled areas of the pattern, independent of selected writing speed, which may be up to 5 inches per second, in this illustrated embodiment of the invention, is obtained by the conjoint control of the ink pump motor controller 36 and the x and y motor controllers 29 and 30. Consider by way of an example a selected writing speed (speed of relative motion of the pen with respect to the moving substrate on the table) of 2 inches per second and a cross-sectional area of line of $40 \times 10^{-7}$ square inches. The ink motor 32 advances approximately 7.8 microinches, in this example, for each pulse which is applied to the ink pump motor controller 36. The geometry of the pump volumes 70 and 72 are such that a certain volume of ink will be displaced for each 7.8 microinch advance of the ram. In this example the pump volume geometry is such that the volume of ink displaced is $1.64 \times 10^{-8}$ cubic inches per pulse applied to the ink pump motor controller. At a 2 inch second writing speed and with a $40 \times 10^{-7}$ inch cross-section of the line to be written, the ink volume requirements are the product or $80 \times 10^{-7}$ cubic inches per second. Since $1.64 \times 10^{-8}$ cubic inches per pulse will delivered by the pump, for an $80 \times 10^{-7}$ cubic inches per second volume requirement to be achieved, the pulse rate must be 487.8 pulses per second. A simple algorithm in the interface controller 38 provides the necessary pulse rate with the known constant volume displacement of the pump and the desired parameters as inputted from the computer 40 (e.g., line writing speed and cross-section).

Referring to FIG. 2 there is shown the pen with its pen tip 28 supported by the flexural support provided by the ink and pen support tubes 56. The pen is lifted and depressed with respect to the substrate 20 by a electromagnetic coil or solenoid on a core which is of low and preferably zero remnance. This core may be highly purified iron or suitable ferrite ceramic material. The actuation force is applied against a high coercivity magnetic material suitably a samarium cobalt magnet which opposes a non-magnetic spacer at the lower end of the core. A control signal from the microprocessor generates a pen up/down command to a summing amplifier 140 which drives the electromagnet coil through a driver amplifier 142. When the pen up signal is asserted, the energizing current in the coil is increased and the magnet attracted to lift the pen up from the substrate. The magnet is lifted into contact with the spacer. Upon pen down command the current in the coil is reduced gradually to allow the pen tip to descend slowly for a soft landing on the substrate. Then the appropriate inputs are applied to the summing amplifier to establish the necessary magnetic force on the pen tip for dynamic pen control.

The dynamic pen control requires that the vertical position of the pen be sensed continously. This accomplished by an electro-optical sensor using a source of illumination and a light detector. The illuminating source is suitably a light emitting diode (LED) operative in the infra-red. The light detector is suitably an infra-red responsive photo transistor. A vane carried by the flexural support tubes 56 intercepts the beam of infra-red illumination. The amount of the beam which is intercepted and the amplitude of the illumination detected by the photo transistor is proportional to the position of the vane and therefore of the vertical displacement of the pen tip 28. A square wave driver 144 and a synchronous detector 146 are used much in the same manner as in linear analogue optical switches to provide the pen height signal (d). This pen height signal (d) is therefore an analogue signal the amplitude of which is directly proportional to the vertical displacement of the pen tip. Other displacement sensors, for example with Hall effect devices may be used. The electro-optical sensor is, however, preferred.

Figure 9:
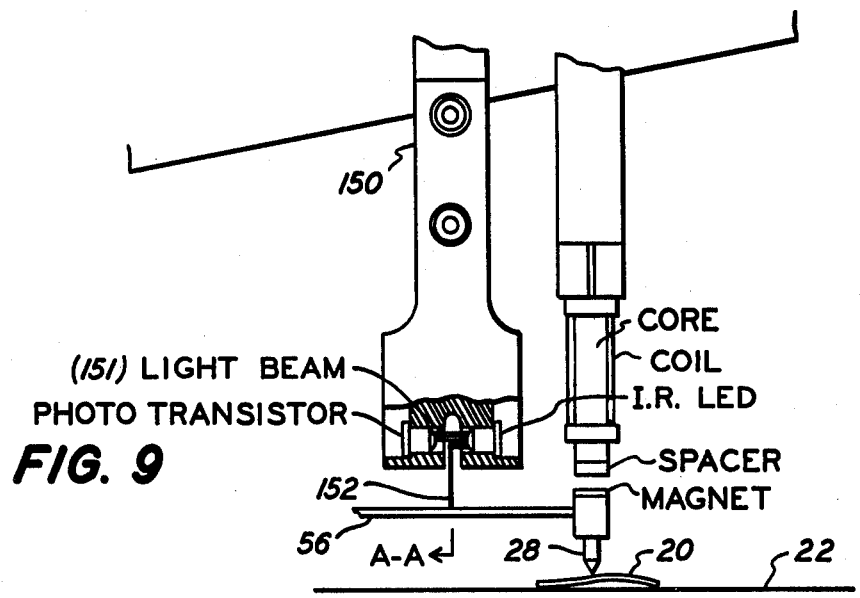
FIG. 9 is a fragmentary elevational view of the pen, its lift mechanisim and the electro-optical mechanisim associated therewith for sensing the vertical displacement of the pen with respect to the substrate.
Figure 10:
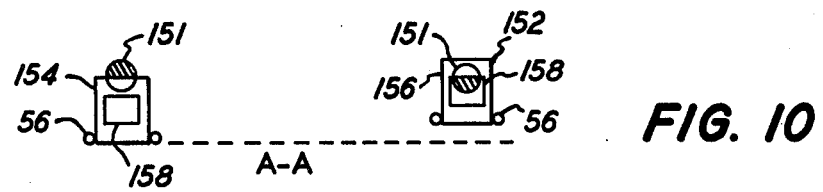
FIG. 10 is a schematic view of the vane used in the electro optical assembly shown in FIG. 9, the view being taken along the line A—A in FIG. 9.

A vertical position meter 148, suitably a zero center meter, calibrated to zero at the center of the dynamic range of the sensor system (including the driver 142, detector and photo transistor, LED arrangement). The meter thus enables monitoring visually the vertical position of the pen tip with respect to the center of the dynamic range. A microscope therefore need not be used in the setup adjustments of the writing system. Referring to FIGS. 9 and 10, it will be seen that the sensor is mounted in a bracket 150 closely adjacent to the electromagnet coil. The vane 152 is shown mounted on the pen support tubes 56 in a first position at 154 where it is in writing relationship with the substrate and in a second position a 156 where it is lifted to the pen up position; the magnet being in contact with the non-magnetic spacer, as is the condition during loading new substrates and entering of data into the computer. The vane 152 has an aperture 158. It will be noted that in the writing position at 154, the beam 151 of illumination is partially blocked by the vane. Also in the up position as shown at 156 the beam 151 is also partially blocked, even though the optical sensor is not being used when the pen is in the pen up position. The passage of illumination through the aperture 158 in the pen up position maintains continuity of illuminating energy on the junction of the photo transistor. The temperature of the junction thus is maintained and thermal drift errors in the pen height signal at the beginning of inking when the pen is brought down towards the substrate are minimized.

Figure 11:
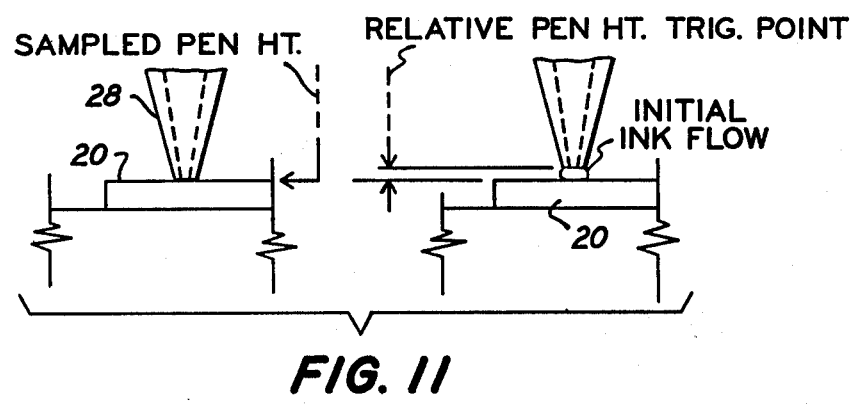
FIG. 11 is a schematic view illustrating the pen tip and substrate during initial ink flow from the writing orifice.
Figure 12:
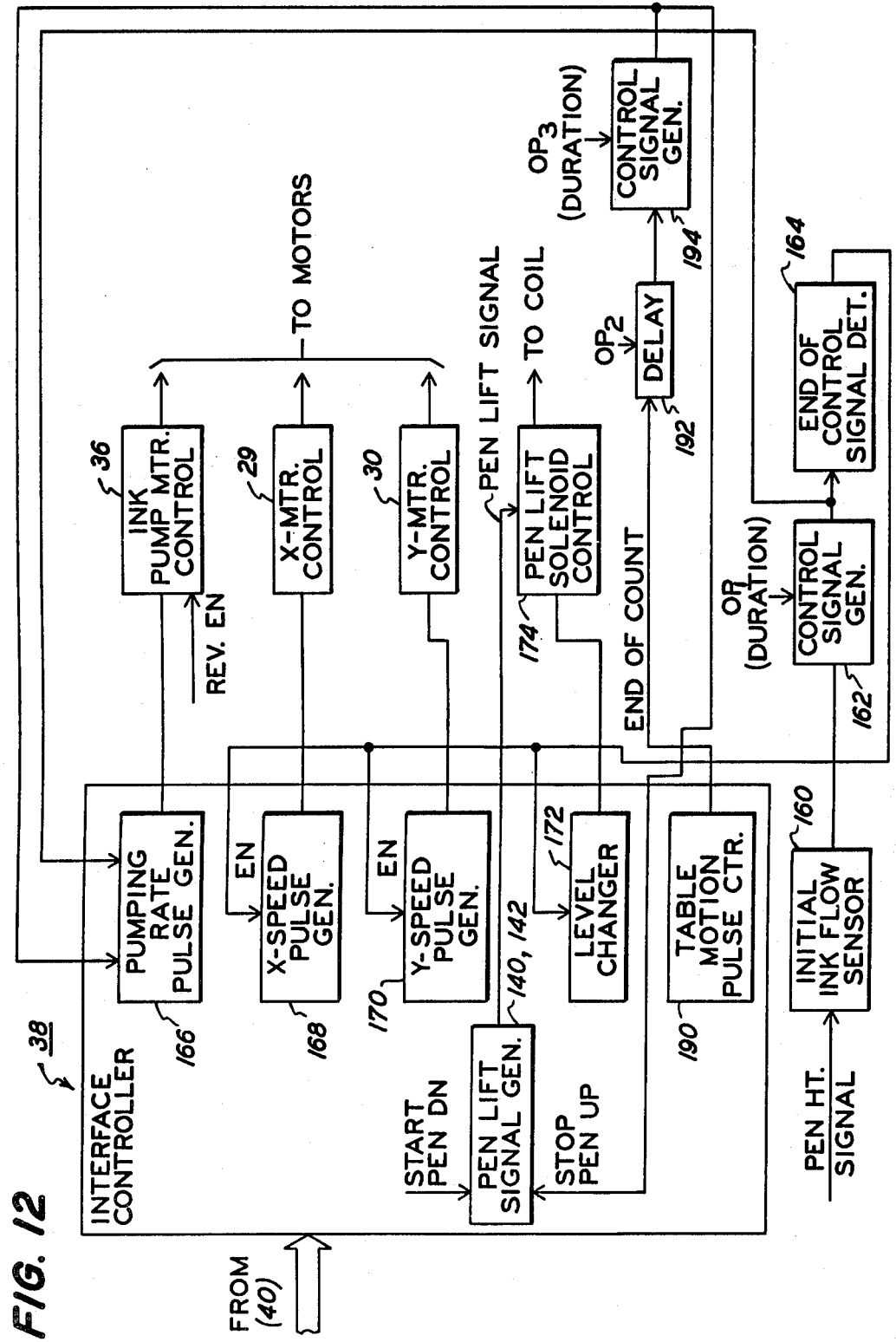
FIG. 12 is a block diagram illustrating the portions of the inking system operative to control and maintain constant cross-section of line at starts and terminations of lines during the writing thereof.
Figure 13:
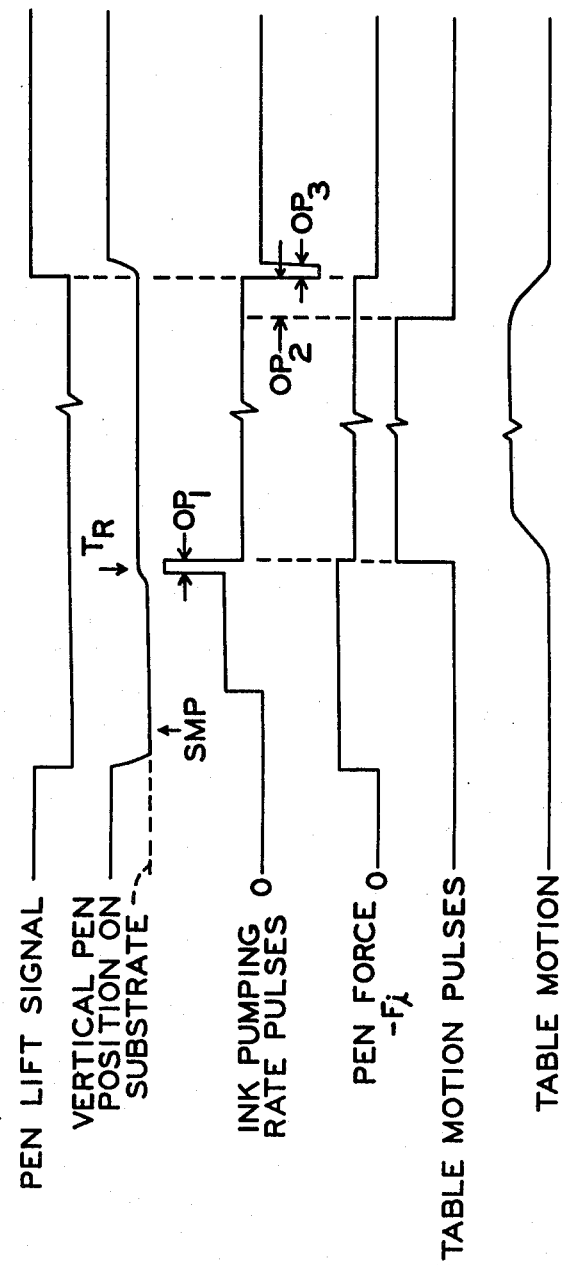
FIG. 13 is a timing diagram illustrating the operation of the portions of the system which are shown in FIG. 12.

Returning to FIG. 2 and also to FIG. 11, the operation of the system upon initial ink flow is illustrated. Upon start of line, the pen tip 28 is allowed to drop into contact with the substrate 20 as above discussed. FIG. 13 also shows the process. The pen lift signal which has actuated the electromagnet to hold the pen tip up against the non-magnetic spacer drops in amplitude. The vertical pen position thus changes as the pen reaches the substrate. After a suitable settling delay and indicated on the vertical pen position diagram as SMP a sample of the pen height signal is taken and held as in a sample and hold circuit. This sample and hold circuit is contained in the ink flow sensor 160 (see FIG. 12). The flow of ink is started by the application of the pulses which control the ink pumping through the ink pump motor controller 36 (FIG. 1). Pumping of ink is initiated at a pre-pen lift pumping rate which may be different from the pumping rate used during inking of the line which is commanded by the computer so as to maintain uniformity of cross-section of line at different writing speeds. As the ink begins to flow, the viscous forces of the extruding ink, as shown on the right in FIG. 11, causes the pen 28 to rise. The pen height signal, which represents the vertical pen position, increases. When that signal reaches a preset level relative to the level at the sampling time, SMP, information is obtained for starting the table motion and also for increasing the pressure to provide immediate compensation for the stored energy compression in the ink. Functionally, the ink flow sensor 160 (FIG. 12) provides an output when the relative amplitude of the vertical displacement signal reaches the threshold level to trigger a control signal generator 162. The trigger point, TR, is indicated in FIG. 13 on the vertical pen position diagram. The control signal generator generates a pulse, the duration of which may be set under operator control (the operator providing a control signal OP₁). This control signal is applied to a pumping rate pulse generator 166 in the interface controller 38 which then increases the pulse rate to the ink pump motor controller 36. The end of the control signal pulse is the detected by an end of control signal detector 164 which responds to the lagging edge of the control pulse. This end of control signal enables the generators 168 and 170 which generate the speed control pulses for the x motor and y motor controllers 28 and 30. The table motion pulses which go these controllers 28 and 30 then start as shown in FIG. 13. Also a level changer 172 is enabled to apply the pen force signal to the pen lift solenoid controller 174. This solenoid controller is provided by circuits in the summing amplifier 140 and by the driver amplifier 142. This enables the pen force signal as inputted from the computer to be applied to the electromagnet coil. This pen force signal plays a part in the dynamic control of the vertical displacement of the pen as will be discussed below. Inasmuch as an appropriate pumping rate is selected at line start to overcome ink compression, the line which is written is uniform at line start as well as throughout the writing of the line. The system also accomodates for the energy in the ink upon termination of the line.

Before discussing the operation of the system upon line termination, the dynamic pen control during the writing of the lines will be considered. This dynamic pen control is based on direct ink sensing by the pen tip 28 itself, and provides pen tracking of any substrate camber or cross-over contour without the use of a surface sensing "outrigger" probe at the pen tip. The electro-optical sensor monitors vertical pen tip location and exerts appropriate magnetic feedback forces via the summing amplifier 140 and driver amplifier 142 on the pen tip 28 (See FIG. 2). The feedback system electronically eliminates the spring constant of the pen tip supporting and ink feed structure. It also provides appropriate acceleration assist forces to reduce the inertia of the pen tip. A suitable design may have an operating band width of 200 hz. With the dynamic pen control activated, the pen tip does not oscillate when the pen force is set to zero. The pen tip floats vertically as though in zero G space, attached to a "rubber" tube support. The magnetic feedback forces which drive the pen tip are derived from a sum of currents representing the terms of a second order differential equation that governs the pen dynamics. These currents are generated in the computer so far as the constant pen force $-F_i$ in concerned. The other currents are generated from the pen height signal d (by amplifiers and differentiating circuits). There is a spring compensation which may be generated by a spring compensation circuit 178 which may be an amplifier. The mass compensation component is generated by a circuit 180 which may include a double diferrentiating amplifier. The second order differential equation that governs the dynamic pen control is:

$$F_h = kd + KW_N(1/g)\ddot{d} - F_i$$

where: $F_h$ is the magnetic lift force; $F_l$ is the lift force from the viscous ink flow which is acting on the pen; $-F_i$ is the pen force in the opposite direction to the lift force); $W_N$ is the weight equivalent of net effective dynamic pen mass; k is the spring constant of the pen support and ink delivery tubes structure 56; K is a lag constant which is less than but near unity (where $1/(1-K)$ is the acceleration force gain of the feedback system); g is the gravitational acceleration constant; and d is the vertical pen displacement. Inasmuch as the equilibrium position of the pen is taken at the rest position of the pen and flexural support structure 56 as determined by the weight of the pen and its support and the counter action against this weight of the magnetic attraction of the magnet to the core of the electromagnet, no constant weight term need be considered in the second order differential equation given above.

It will be noted that the first term, kd, produces a force that exactly balances the spring force when the pen is vertically displaced from its equilibrium position. The spring compensation circuitry 178 can compensate for any non-linearity due to the variable magnet gap between the magnet on the pen tip 28 and the electromagnet coil.

The second term in the equation provides the force required for vertical acceleration of the pen tip. This term is only activated when writing over pre-fired lines, since accelerations required for following substrate camber are usually low. This term is effectively a force amplifier term which produces an acceleration force gain identified above. Oscillation will not occur as long as K is less than unity. The K value can be set by the operator for the amount of acceleration force gain desired. A suitable acceleration range has been found to be plus or minus 2g. As noted above, without the $F_i$ term activated, the spring term, kd, completely eliminates the spring effect of the pen tip supporting structure. If the pen tip is set into oscillation while the electronics is turned off, the oscillation is abruptly stopped when electronics is turned on, the pen tip again floating freely and remaining at any vertical level to which it is pushed. The $F_i$ term provides constant, preset downward pen force which remains constant, even when following the vertical contours due to camber of the substrate surface. Typically, for 4 and 8 mil wide lines, the pen force may vary between 50 and 250 milligrams, depending upon the ink material characteristics.

As discussed in connection with FIGS. 1, 11, 12 and 13 uniform line cross-sections are obtained on start of line by sensing the inception of ink flow, based on the rising pen height crossing a preset relative trigger height above the substrate. This output may be independent of the rate of pen rise. However, alternatively, the system may be triggered to initiate table movement and increased ink flow at line start by sensing the upward vertical pen velocity at the inception of ink flow. This may be accomplished by differentiating the vertical displacement signal d, and when the differentiated vertical displacement signal corresponds to a preset velocity threshold, an output may be provided to represent the start of ink flow. This output may in turn be used as the start signal to initiate table motion. At the present time the use of the preset relative trigger height threshold is preferred over pen lift velocity sensing. The velocity signal may be used to monitor vertical pen position deviations due to ink nonuniformity. The signal may be translated into an audible tone giving the operator a very useful monitor of ink quality during inking.

Returning to FIGS. 12 and 13 it will be noted that interface controller 38 has a table motion pulse counter 190. The end of the table motion is computed as a function of the line length. The table motion pulses, which are provided by the table motor pulse generators 168 and 170 terminate at the end of a line. This is shown in the timing diagram depiction of the table motion pulses. As shown by the curve depicting the table motion in the timing diagram of FIG. 13, acutal termination of table motion and actual termination of the line lags the end of the table motion pulses. During this time lag the expansion of the ink must be accomodated in order to maintain uniformity of the line cross-section. This is accomplished by means of a delay circuit 192 and another control signal generator 194. The delay circuit 192 interposes a operator preset delay (OP$_2$) from the termination of the table command pulses until the control signal generator 194 is triggered to produce its control pulse. The duration of this control pulse may also be preset by the operator and is indicated OP$_3$. At the leading edge of the pulse from the control signal generator 194, the ink pump motor controller 36 is reversed by utilizing the pulse as a reverse enable control. The pulses also apply to the pumping rate pulse generator 166 and increase the pump rate. Accordingly the ink pump is reversed to relieve the ink pressure which was maintained during normal writing. The expansion of the ink upon termination is therefore compensated and line uniformity maintained. At the end of the pulse from the control signal generator 194 the ink pump rate is set to zero and pumping stops. The leading edge of the pulse from the control signal generator 124 also initiates pen lift and removes the pen force. The system shown in FIG. 12 may be implemented in the microprocesser controller by appropriate programming.

From the foregoing description it will be apparent that there has been provided an improved inking system which is especially suitable for computer aided design and computer aided manufacture of thick film hybrid cirucits. While a preferred embodiment of the system has been described in order to elucidate the invention, variations and modifications of the herein described system, within the scope of the invention, will undoubtedly suggest themselves to those skilled in the art. Accordingly the foregoing descriptiion should be taken as illustrative and not in a limiting sense.

I claim:

1. For use in producing patterns on a substrate with viscous material and with the aid of flexurally supported member having an orifice, a system comprising means for moving said substrate with respect to said member, means for controllably feeding said viscous material through said orifice at a volume rate synchronous with the rate of relative movement of said member and substrate, and means coupled to said member and responsive to the viscous forces on the viscous material flowing from said orifice upon said substrate for allowing said viscous forces to determine the vertical displacement of said member to maintain a constant thickness of line of said material in said pattern for a given cross-sectional area of said line.

2. The invention or set forth in claim 1, wherein said feeding means includes means for extracting from a supply of said material a volume of said material much smaller than the volume of said supply, and means for pumping said material through said orifice from said smaller volume at a constant volume displacement rate.

3. The invention as set forth in claim 1 further comprising a supply of said viscous material and wherein said feeding means has means for maintaining said material separate from said supply in a closed volume out of which said material is pumped to said member thereby minimizing storage of compression energy while said material is pumped thereby enabling rapid and accurate starting and terminating of said line.

4. The invention as set forth in claim 3 wherein said pumping means comprises a block having a pair of volumes for said viscous material, means for supplying viscous material to one of said volumes while pumping and delivering viscous material to said member from the other of said volumes and alternately supplying viscous material to the other of said volumes while pumping and delivering viscous material to said member from said one of said volumes.

5. The invention as set forth in claim 4 wherein said supplying and pumping means comprises a four-way valve provided by a cylindrical valve body rotatable in an opening in said block, said block having a passage for the supply of viscous material, passages in said valve body for communicating said supply passage to one or the other of said volumes when said valve body is in different angular positions, said block having an outlet passage communicating with said member opposed to said supply passage for alternately communicating with said volumes by way of said valve passages when said valve body is in said different angular positions, said valve body having an axial tapered aperture, and a tapered member disposed in said aperture expanding said valve body circumferentially to provide a zero clearance in said block opening.

6. The invention as set forth in claim 5 wherein said tapered aperture is threaded and said expanding member is threaded into said tapered threaded aperture.

7. The invention as set forth in claim 5 wherein said expanding member is a tapered metal pin.

8. The invention as set forth in claim 4 wherein said pumping means comprises a pair of double acting displacement rams in pumping relationship with said volumes in said block, and means responsive to the displacement of said rams for reversing the direction of displacement thereof.

9. The invention as set forth in claim 4 further comprising an assembly for supporting said member flexurally from said block and having a pair of tubes defining a triangle with a side of said block, said member being a pen tip interchangeably attached to the apex of said tubes, at least one of said tubes providing a conduit for delivery of said viscous material to said member.

10. The invention as set forth in claim 9 wherein an viscous material supply syringe is assembled to said block on the opposite side thereof from said tubes which provide said flexural support to provide to a modular, interchangeable assembly of said block, syringe, pen tip, delivery and support tubes, and pumping means to enable rapid interchangeability of viscous materials.

11. The invention as set forth in claim 1 wherein said vertical displacement allowing means comprises means for compensating for the spring displacement force on said flexurally supported member.

12. The invention as set forth in claim 1 further comprising means for applying acceleration forces for reducing the inertia of said member presented to said viscous material.

13. The invention as set forth in claim 1 wherein said vertical displacement allowing means comprises electromagnetic means for vertically displacing said member and applying vertical forces thereto to lift and depress said member, means for sensing the displacement of said member, and means for applying feedback forces to said member to satisfy the equation $$F_h = kd + K W_N (1/g)\ddot{d} - F_i'$$

where: $F_h$ is the magnetic lift force; $F_i$ is the preselected lift force from the viscous material flow; $W_N$ is the weight equivalent of the net effective dynamic pen mass; k is the spring constant associated with said member; K is the lag or stability constant less than unity, where $1/(1-K)$ is the force gain of the system which applies forces to said member; g is the gravitational acceleration constant; and d is the vertical displacement of said member.

14. The invention as set forth in claim 13 wherein said member is mounted on flexural support means, electro-optical means including a vane mounted on said flexural support means for providing an output signal corresponding to the vertical displacement of said member.

15. The invention as set forth in claim 14 wherein said vane has an aperture therein, said electro-optical means including a junction photo transistor, and means for illuminating said photo transistor, said aperture being disposed to provide a path for said illumination to said photo transistor when said member is lifted to full vertical displacement above said substrate.

16. The invention as set forth in claim 1 further comprising means for varying the pressure of the viscous material supplied to said member at starts and terminations of the lines of the pattern thereby maintaining constant cross-section of line and compensating for compression and expansion of ink at said starts and terminations.

17. The invention as set forth in claim 1 wherein said means for allowing vertical displacement includes means for providing a signal representing the movement of said flexural member in the vertical direction, said flexural member being vertically displaced in response to viscous forces, said viscous forces raising said orifice and said member at inception of said viscous material issuing from said orifice, and means for initiating operation of said means for moving said substrate with respect to said member when said signal reaches a predetermined level or rate of level change thereof signifying said inception.

18. In a system for writing patterns of viscous material on a substrate with the aid of a pen member having an orifice, the improvement comprising means for moving said substrate with respect to said member, means for controllably feeding said viscous material through said orifice at a volume rate synchronous with the rate of relative movement of said member and substrate, a supply of said viscous material, pumping means for pumping said material through said orifice, said pumping means having means for maintaining said viscous material in a closed volume separate from said supply out of which closed volume said viscous material is pumped to said member thereby minimizing storage of compression energy while said viscous material is pumped.

19. The invention as set forth in claim 18 wherein said pumping means comprises a block having a pair of volumes for said material, means for supplying material to one of said volumes while pumping and delivering material to said member from the other of said volumes and alternately supplying material to the other of said volumes while pumping and delivering material to said member from said one of said volumes.

20. The invention as set forth in claim 19 wherein said supplying and pumping means comprises a four-way valve provided by a cylindrical valve body rotatable in an opening in said block, said block having a passage for the supply of viscous material, passages in said valve body for communicating said supply passage to one or the other of said volumes when said valve body is in different angular positions, said block having an outlet passage communicating with said member opposed to said supply passage for alternately communicating with said volumes by way of said valve passages when said valve body is in said different angular positions, said valve body having an axial tapered aperture, and a tapered member disposed in said aperture expanding said valve body circumferentially to provide a zero clearance in said block opening.

21. The invention as set forth in claim 20 wherein said tapered aperture is threaded and said expanding member is threaded into said tapered threaded aperture.

22. The invention as set forth in claim 20 wherein said expanding member is a tapered metal pin.

23. The invention as set forth in claim 18 wherein said pumping means comprises a pair of double acting displacement rams in pumping relationship with said volumes in said block, and means responsive to the displacement of said rams for reversing the direction of displacement thereof.

24. The invention as set forth in claim 18 further comprising an assembly for supporting said member flexurally from said block and having a pair of tubes defining a triangle with a side of said block, said member being a pen tip interchangeably attached to the apex of said tubes, at least one of said tubes providing a conduit for delivery of said viscous material to said member.

25. The invention as set forth in claim 24 wherein a viscous material supply syringe is assembled to said block on the opposite side thereof from said tubes which provide said flexural support to provide to a modular, interchangeable assembly of said block, syringe, pen tip, delivery and support tubes, and pumping means to enable rapid interchangeability of viscous materials.

26. In a system for writing patterns of viscous material on a substrate with the aid of a pen member having an orifice, the improvement comprising means for moving said substrate with respect to said member, means for controllably feeding said material through said orifice at a volume rate synchronous with the rate of relative movement of said member and substrate, and means for varying the pressure of said viscous material supplied to said member at starts and terminations of the lines of the pattern thereby maintaining constant cross section of line and compensating for compression and expansion of ink at said starts and terminations.

27. In a system for writing patterns of viscous material on a substrate with the aid of a pen member having an orifice, the improvement comprising a flexural support for said pen member enabling vertical displacement thereof with respect to said substrate, and means responsive to the viscous forces of the viscous material flowing from said orifice upon said substrate for dynamically allowing the vertical displacement of said member to follow and maintain a substantially constant thickness of line in said pattern for a given cross-sectional area of said line.

28. The invention as set forth in claim 27 wherein said vertical displacement allow means comprises means for compensating for the spring displacement force of said flexural support on said member.

29. The invention as set forth in claim 27 further comprising means for applying acceleration forces for reducing the inertia of said member presented to said viscous material.

30. The invention as set forth in claim 27 wherein said vertical displacement controlling means comprises electromagnetic means for vertically displacing said member and applying vertical forces thereto to lift and depress said member, means for sensing the displacement of said member, and means for applying feedback forces to said member to satisfy the equation $$F_h = kd + KW_N(1/g)\ddot{d} - F_i'$$

where: $F_h$ is the magnetic lift force; $F_i$ is the preselected lift force from the viscous material flow; $W_N$ is the weight equivalent of the net effective dynamic pen mass; k is the spring constant associated with said member; K is the lag or stability constant less than unity, where $1/(1-K)$ is the force gain of the system which applies forces to said member; g is the gravitational acceleration constant; and d is the vertical displacement of said member.

31. The invention as set forth in claim 30 wherein said member is mounted on flexural support means, electro-optical means including a vane mounted on said flexural support means for providing an output signal corresponding to the vertical displacement of said member.

32. The invention as set forth in claim 30 wherein said vane has an aperture therein, said electro-optical means including a junction photo transistor, and means for illuminating said photo transistor, said aperture being disposed to provide a path for said illumination to said photo transistor when said member is lifted to full vertical displacement above said substrate.

33. The invention as set forth in claim 27 wherein said system includes means for moving said substrate and pen member with respect to each other, and said means for controlling vertical displacement includes means for providing a signal representing the movement of said member in the vertical direction, and means for initiating operation of said means for moving said substrate with respect to said member when said signal reaches a change in amplitude or rate of amplitude change signifying the inception of ink flow through said orifice.

34. In a system for writing patterns of viscous material on a substrate with the aid of a pen member having an orifice, and means for moving said member and substrate with respect to each other, the improvement comprising means for confining a volume of said material representing a small portion of the volume of a supply reservoir of said material, means communicating said confined volume and said orifice with each other, and means for hydraulically displacing said material from said confined volume through said communicating means and through said substrate in proportion to the movement of said substrate for controllably feeding said material through said orifice at a volume rate synchronous with the rate of relative movement of said member and substrate with respect to each other.

35. The improvement according to claim 34 wherein said means for by hydraulically displacing said material from said confined volume comprises a rod which extends into said confined volume, said rod having a cross-section smaller than the cross section of said confined volume through which it extends.

36. The improvement according to claim 34 further comprising valve means interconnecting said confined volume and the reservoir of said material for opening and then closing off said confined volume from said reservoir after said confined volume is filled with said material.

* * * * *